United States Patent
Hughes et al.

(10) Patent No.: US 11,789,036 B2
(45) Date of Patent: *Oct. 17, 2023

(54) REAL-TIME ISOLATION OF SELF-TEST AND LINEAR ACCELERATION SIGNALS

(71) Applicant: INVENSENSE, INC., San Jose, CA (US)

(72) Inventors: Kevin Hughes, San Jose, CA (US); Giacomo Laghi, Los Gatos, CA (US); Vito Avantaggiati, Rome (IT)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/695,077

(22) Filed: Mar. 15, 2022

(65) Prior Publication Data

US 2022/0229086 A1    Jul. 21, 2022

Related U.S. Application Data

(63) Continuation of application No. 16/881,732, filed on May 22, 2020, now Pat. No. 11,307,218.

(51) Int. Cl.
| | | |
|---|---|---|
| *G01P 21/00* | (2006.01) | |
| *G01P 15/125* | (2006.01) | |
| *G01P 15/08* | (2006.01) | |

(52) U.S. Cl.
CPC ............ *G01P 21/00* (2013.01); *G01P 15/125* (2013.01); *G01P 2015/0868* (2013.01)

(58) Field of Classification Search
CPC ........ G01P 15/125; G01P 15/18; G01P 15/08; G01P 2015/0868; G01P 21/00; B81C 99/0045

See application file for complete search history.

(56) References Cited

U.S. PATENT DOCUMENTS

| | | |
|---|---|---|
| 5,488,864 A | 2/1996 | Stephan |
| 6,564,637 B1 | 5/2003 | Schalk |
| 7,093,478 B2 | 1/2006 | Chau et al. |
| 7,340,956 B2 | 3/2008 | Deb et al. |
| 8,173,470 B2 | 5/2012 | Mehregany |
| 10,012,671 B2 | 7/2018 | Lin |
| 11,307,218 B2 * | 4/2022 | Hughes ............... B81C 99/0045 |

(Continued)

FOREIGN PATENT DOCUMENTS

DE    102019215179    4/2021

OTHER PUBLICATIONS

International Search Report and Written Opinion for International Application No. PCT/US2021/032704 dated Aug. 18, 2021 (14 pages).

*Primary Examiner* — Helen C Kwok
(74) *Attorney, Agent, or Firm* — Van Hoven PC; Joshua Van Hoven

(57) ABSTRACT

A MEMS accelerometer includes proof masses that move in-phase in response to a sensed linear acceleration. Self-test drive circuitry imparts an out-of-phase movement onto the proof masses. The motion of the proof masses in response to the linear acceleration and the self-test movement is sensed as a sense signal on common sense electrodes. Processing circuitry extracts from a linear acceleration signal corresponding to the in-phase movement due to linear acceleration and a self-test signal corresponding to the out-of-phase movement due to the self-test drive signal.

20 Claims, 10 Drawing Sheets

(56) References Cited

U.S. PATENT DOCUMENTS

| | | |
|---|---|---|
| 2006/0150709 A1 | 7/2006 | Deb et al. |
| 2010/0037691 A1 | 2/2010 | Jeong |
| 2010/0122579 A1 | 5/2010 | Hsu et al. |
| 2010/0145660 A1 | 6/2010 | Lang et al. |
| 2010/0251800 A1 | 10/2010 | Mueck |
| 2011/0138914 A1 | 6/2011 | Yoshida et al. |
| 2012/0176128 A1 | 7/2012 | Seeger et al. |
| 2014/0251011 A1 | 9/2014 | Zhang et al. |
| 2014/0266170 A1 | 9/2014 | Seeger et al. |
| 2017/0003315 A1 | 1/2017 | Enjalbert et al. |
| 2017/0168086 A1 | 6/2017 | Gafforelli et al. |
| 2018/0113147 A1 | 4/2018 | Enjalbert |
| 2019/0025056 A1 | 1/2019 | Hughes et al. |
| 2019/0064205 A1 | 2/2019 | Tocchio |
| 2020/0011702 A1 | 1/2020 | Clark |
| 2020/0081029 A1 | 3/2020 | Zhang |
| 2020/0264210 A1 | 8/2020 | Dakshinamurthy et al. |
| 2021/0364546 A1 | 11/2021 | Hughes |

\* cited by examiner

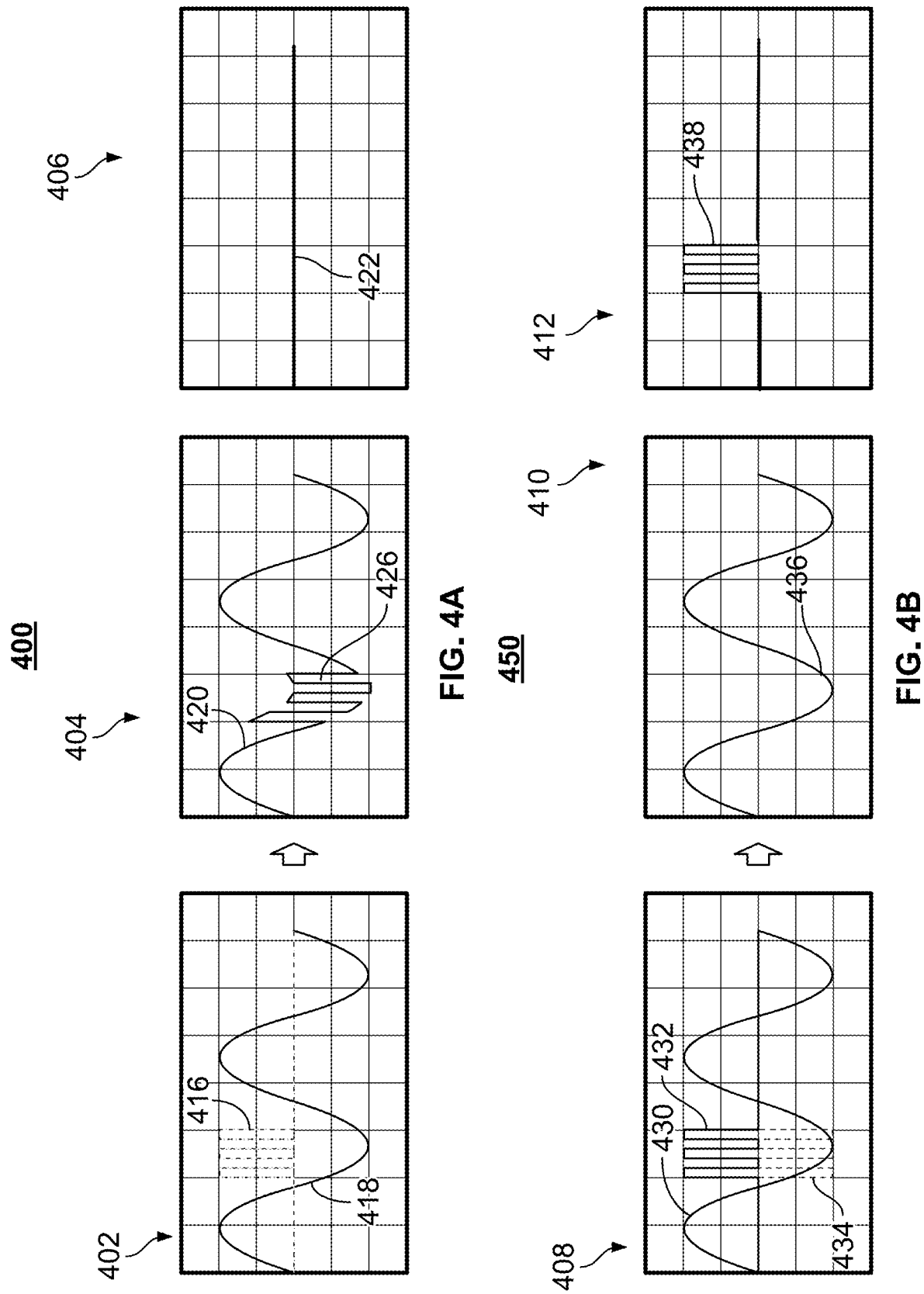

REAL-TIME ISOLATION OF SELF-TEST AND LINEAR ACCELERATION SIGNALS

CROSS-REFERENCE TO RELATED APPLICATIONS

This application is a continuation of U.S. patent application Ser. No. 16/881,732, filed May 22, 2020, the disclosure of which is hereby incorporated by reference herein in its entirety.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) sensors such as accelerometers and gyroscopes capture complex movements and determine orientation or direction. For example, smartphones are equipped with accelerometers and gyroscopes to understand the movement of the smartphone, to augment navigation systems that rely on Global Position System (GPS) information, and to perform numerous other functions. Wearable devices and internet-of-things (IoT) devices constantly measure movement and other characteristics of a person, animal, or electronic device. In another example, drones and aircraft determines orientation based on gyroscope measurements (e.g., roll, pitch, and yaw) and vehicles of all types implement assisted driving to improve safety (e.g., to recognize skid or roll-over conditions).

MEMS sensors, such as MEMS accelerometers, exhibit certain sensitivities that when left unaddressed effectively degrade the quality of sensing operations, and even more so over time. Manufacturing tolerances, mechanical product wear, and operational electronic drift contribute to imprecise sense detection. During sensor manufacture as well as installation within end-use products, sensors may undergo product stress and deformation that cause sensitivity error effects. For example, capacitance-based MEMS sensors, such as accelerometers, may undergo a sense capacitor gap change and sensing circuit gain changes over time. To combat these issues manufacturers attempt to compensate for deviations from ideal or designed sensitivity. For example, manufacturing self-test procedures simulate real world operations by applying inertial forces to sensors or electrostatic forces to sensor proof masses and measuring the responsive sensor behavior against an expected result. The manufacturer then has the opportunity to adjust for sensitivity deviations.

In some instances, accelerometer products are tested for undesirable sensitivity changes by real-time monitoring. One of the ways to monitor MEMS accelerometer sensitivity changes in real time is by applying a self-test signal, designed to cause an expected physical movement of proof mass components of the MEMS accelerometer relative to sense electrodes, and measuring the proof mass acceleration response. The self-test procedure attempts to mimic a motion in response to an acceleration.

SUMMARY

A microelectromechanical (MEMS) accelerometer includes a first proof mass, a second proof mass, first electrodes, and second electrodes. The first electrodes are located adjacent to the first proof mass to sense movement of the first proof mass along a first axis in response to a linear acceleration along the first axis. The second electrodes are located adjacent to the second proof mass to sense movement of the second proof mass along the first axis. The first proof mass and the second proof mass move in-phase along the first axis in response to the linear acceleration along the first axis. A self-test drive circuitry is coupled to the first proof mass and the second proof mass. The self-test drive circuitry is configured to cause the first proof mass and the second proof mass to move out-of-phase along the first axis. Processing circuitry is coupled to the first electrodes and the second electrodes and configured to receive a sense signal and to extract from the sense signal a self-test signal corresponding to the out-of-phase movement of the proof masses and a linear acceleration signal corresponding to the in-phase movement of the proof masses.

A method of self-testing a microelectromechanical (MEMS) accelerometer includes applying a self-test drive signal at a first polarity to a first proof mass and applying the self-test drive signal at a second polarity to a second proof mass. The first polarity of the self-test drive signal is opposite to the second polarity of the self-test drive signal. Applying the first polarity of the self-test drive signal to the first proof mass and applying the second polarity of the self-test drive signal to the second proof mass causes the first proof mass and the second proof mass to move out-of-phase along a first axis. The method further includes detecting a sense signal comprising a linear acceleration signal and a self-test sense signal. The linear acceleration signal corresponds to the first proof mass and the second proof mass moving in-phase and a self-test sense signal corresponds to the first proof mass and the second proof mass moving out-of-phase. The self-test sense signal and the linear acceleration signal are extracted from the sense signal.

BRIEF DESCRIPTION OF THE DRAWINGS

The above and other features of the present disclosure, its nature, and various advantages will be more apparent upon consideration of the following detailed description, taken in conjunction with the accompanying drawings in which:

FIG. 4A depicts graphical representations of an exemplary MEMS accelerometer self-test response with in-phase self-test, in accordance with at least embodiments of the present disclosure;

FIG. 4B depicts graphical representations of an exemplary MEMS accelerometer self-test response with out-of-phase self-test, in accordance with at least some embodiments of the present disclosure;

DETAILED DESCRIPTION OF THE DRAWINGS

Figure 1:
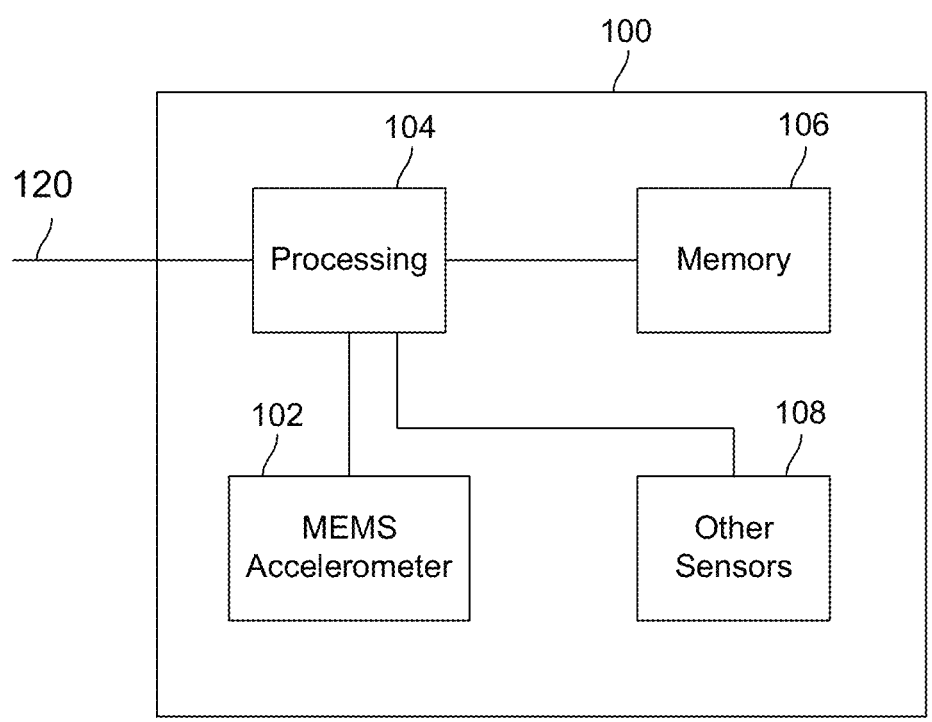
FIG. 1 depicts an exemplary motion sensing system in accordance with at least some embodiments of the present disclosure.

In some applications, such as in the automotive industry, consumer safety requirements encourage maintaining adherence to strict product specifications throughout a product lifetime. Sensor product sensitivity changes of MEMS sensor devices are monitored in real time and during the device in-field operations to identify changes in operation and provide for subsequent compensation or adjustment in light of those changes. This monitoring also allows ongoing reporting on the health of a product throughout the product lifecycle. Notification of product performance degradation, such as component displacements or wear, affords the opportunity to perform compensation for or adjustment of component operation. In accordance with some embodiments and methods, a real-time, power efficient, and robust approach to monitoring and compensating for sensitivity changes of an in-field MEMS sensor device is disclosed.

The MEMS sensor device may be a capacitance-based MEMS sensor, such as without limitation, a MEMS accelerometer. Performance of the MEMS sensor device is maintained and improved over the lifetime of the device by implementing a vibration-robust self-test processing circuitry. Further, the processing circuitry improves the functional safety of the MEMS sensor device over the device lifetime.

In some embodiments, self-test mechanisms are implemented to estimate the MEMS sensor device sensitivity by measuring an amplitude response to an applied electrostatic force to facilitate compensation for an undesirable sensor response (e.g., gain change) or to raise awareness of a potential electrical or mechanical component degradation, for example. The self-test routine stimulates an out-of-phase motion of proof masses (e.g., out-of-phase as compared to a typical in-phase movement of the proof masses in response to a measured force such as linear acceleration), generating a responsive signal distinguishable from signals generated by regular in-field device operations, such as linear acceleration or vibration-related signals. For example, in a MEMS accelerometer the motion applied to the accelerometer proof masses by the self-test routine is out-of-phase compared to the proof mass response to a sensed linear acceleration. Respective MEMS accelerometer proof masses may be designed to move in a particular manner with respect to each other (e.g., an in-phase response to linear acceleration). These same respective proof masses may be excited out-of-phase by the self-test motion, such that the out-of-phase self-test response can be distinguished from the in-phase response to linear acceleration.

In response to a self-test signal applied to the proof masses of the MEMS sensor device, an electrostatic force sets the proof masses of the device in an out-of-phase motion. Even in the presence of an external linear acceleration that also causes movement of the proof masses, the in-phase component due to linear acceleration can be distinguished and isolated from the out-of-phase self-test component. The sensed linear acceleration and the monitored self-test response are extracted for further processing, for example, to perform compensation and/or to generate a monitoring signal (e.g., representative of sensor health).

In an exemplary embodiment of differential sensing of in-phase linear acceleration by a MEMS accelerometer, the sense signal induced by the out-of-phase self-test motion is a common-mode signal. Unlike conventional self-test techniques where the self-test motion imparted on respective proof masses results in similar respective directions of movement as with linear acceleration, the self-test motion is observable even in the presence of an unknown linear acceleration or other in-phase vibration.

Exemplary processing circuitry of a differential sensing MEMS accelerometer may detect a linear acceleration signal based on the opposite polarities (+/−) of changes in the values of the respective capacitors formed between MEMS sensor device proof masses and corresponding sense electrodes due to linear acceleration, and may monitor a self-test output signal based on a common polarity (+/+or −/−) of changes in the values of the respective capacitors formed between the proof masses and corresponding sense electrodes due to the self-test movements. In some embodiments, the differential response and the common-mode response are effectively multiplexed at the sense capacitors to effect power conservation and circuit component savings and subsequently demultiplexed to extract each portion of the sensed response. The responses are further processed by separate circuit paths after demultiplexing/extraction. Alternatively, the differential (linear acceleration) response and the common-mode (self-test) response may be sensed from the sense capacitors in parallel therefore avoiding multiplexing and demultiplexing the responses, with a tradeoff of larger circuit footprint and increased power consumption because parallel signal conversion (e.g., capacitance-to-voltage conversion) may require additional circuit components in the processing circuitry.

The common-mode response is processed to identify a sensitivity change (e.g., a change in mechanical or electrical response, such as a gain change) in the system to facilitate safety monitoring and sensitivity compensation. Operational parameters such as gain scaling, filtering, offset values, and sensitivity scaling can be modified based on the sensitivity change. In some embodiments, errors and warnings may be provided to other circuitry, facilitating alternative compensation or calculation techniques (e.g., based on outputs from other sensors or components).

In some embodiments, drive carrier signals applied to respective proof masses may have different signal characteristics (e.g., frequency and/or phase). For example, applying a frequency multiple (e.g., 2×) to a subset of the proof masses facilitates multiplexing of the linear acceleration and self-test signals (e.g., because during a portion of a measurement cycle the proof mass drive signals are in-phase, and during other portions the proof mass drive signals are out-of-phase). In some embodiments, the frequency of the periodic carrier signals is the same, but the signals are out of phase. In some embodiments, the drive carrier signals are periodic and the frequency of one periodic carrier signal is a multiple of the frequency of the other periodic carrier signal to achieve separated differential and common mode sensing.

FIG. 1 depicts an exemplary motion sensing system 100 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS accelerometer 102 (e.g., a single- or multi-axis accelerometer for measuring linear acceleration along one or more axes) and supporting circuitry, such as processing circuitry 104 and memory 106. In some embodiments, one or more additional sensors 108 (e.g., MEMS gyroscopes, additional MEMS accelerometers, MEMS microphones, MEMS pressure sensors, and a compass) may be included within the motion processing system 100 to provide an integrated motion processing unit ("MPU") (e.g., including 3 axes of MEMS gyroscope sensing, 3 axes of MEMS accelerometer sensing, microphone, pressure sensor, and compass).

Processing circuitry 104 may include one or more components providing necessary processing based on the requirements of the motion processing system 100. In some embodiments, processing circuitry 104 may include hardware control logic that may be integrated within a chip of a sensor (e.g., on a substrate or capacitor of a MEMS accelerometer 102 or other sensor 108, or on an adjacent portion of a chip to the MEMS accelerometer 102 or other sensor 108) to control the operation of the MEMS accelerometer 102 or other sensors 108 and perform aspects of processing for the MEMS accelerometer 102 or other sensors 108. In some embodiments, the MEMS accelerometer 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS accelerometer 102 by interacting with the hardware control logic, and process signals received from MEMS accelerometer 102. The microprocessor may interact with other sensors in a similar manner.

Although in some embodiments (not depicted in FIG. 1), the MEMS accelerometer 102 or other sensors 108 may communicate directly with external circuitry (e.g., via a serial bus or direct connection to sensor outputs and control inputs), in an embodiment the processing circuitry 104 may process data received from the MEMS accelerometer 102 and other sensors 108 and communicate with external components via a communication interface 110 (e.g., a SPI or I2C bus, in automotive applications a controller area network (CAN) or Local Interconnect Network (LIN) bus, or in other applications suitable wired or wireless communications interfaces as is known in the art). The processing circuitry 104 may convert signals received from the MEMS accelerometer 102 and other sensors 108 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS accelerometer 102 or other MEMS sensors 108.

In some embodiments, certain types of information may be determined based on data from multiple MEMS inertial sensors 102 and other sensors 108, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS accelerometer 102 may include one or more movable proof masses that are configured in a manner that permits the MEMS sensor to measure a desired force (e.g., linear acceleration) along an axis. In some embodiments, the MEMS accelerometer may be configured for simultaneous self-test and measurement of linear acceleration. The MEMS accelerometer proof masses, sense electrodes, and sense circuitry of the MEMS accelerometer may perform differential sensing based on in-phase movements of the proof masses in response to linear acceleration. By applying out-of-phase self-test movements to the proof masses, the sensing of the self-test movements is a common mode sensing. The movements in response to linear acceleration and self-test are mechanically multiplexed based on the movement of the proof masses. Either through distinct sense circuitry (e.g., common-mode and differential coupled C2V circuitry) or demultiplexing of output signals from common mode sense circuitry, the respective outputs due to linear acceleration and self-test can be isolated and processed to measure both linear acceleration and accelerometer sensitivity in real time.

Figure 2:
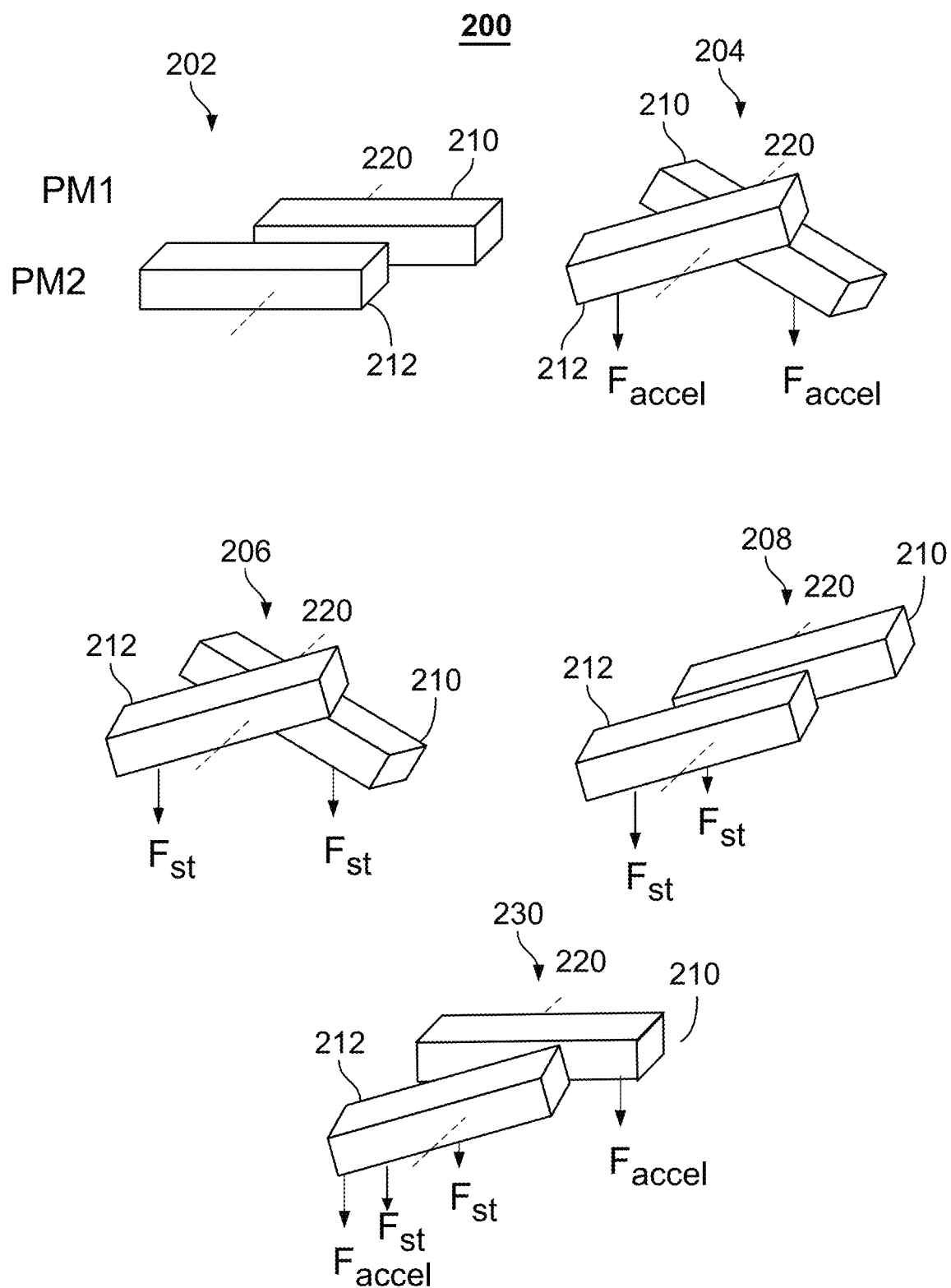
FIG. 2 depicts exemplary movements of proof masses of an out-of-plane MEMS accelerometer in accordance with at least some embodiments of the present disclosure.

FIG. 2 shows exemplary movement of proof masses of an exemplary out-of-plane MEMS accelerometer in accordance with some embodiments of the present disclosure. The proof masses of FIG. 2 and subsequent figures depict nonlimiting examples of MEMS accelerometer devices. FIG. 2 shows exemplary proof masses of an out-of-plane accelerometer (e.g., a z-axis accelerometer) in response to different applied forces in accordance with some embodiments of the present disclosure. MEMS accelerometer 200 is shown to include two proof mass components, a proof mass 210 and a proof mass 212, positioned about an axis of rotation 220 within the plane of a MEMS layer of MEMS accelerometer 200. Each of the proof masses 210 and 212 is offset with respect to axis of rotation 220, such that a z-axis acceleration causes opposite ends of the respective proof masses to move in unison (i.e., in phase).

At 202, MEMS accelerometer 200 is shown with proof mass 210 and proof mass 212 in at rest in-plane configuration along axis of rotation 220. At 202, proof masses 210 and 212 are static, exhibiting no movement since linear acceleration along the sense axis (e.g., z-axis) remains absent. At 204, MEMS accelerometer 200 is shown with proof mass 210 and proof mass 212 moving in-phase about axis of rotation 220 in response to a linear acceleration, caused by application of a linear acceleration force ("$F_{accel}$"). In this configuration, movement of proof masses 210 and 212 is in-phase along the linear acceleration direction.

At 206, MEMS accelerometer 200 is shown with proof mass 210 and proof mass 212 having an in-phase self-test signal applied to cause movement of the proof masses 210 and 212. As depicted at 206, the force ("$F_{st}$") of the exemplary self-test movement (e.g., caused by electrodes, not depicted) is in-phase about the axis of rotation 220 similar to an applied linear acceleration. In the presence of an applied linear acceleration as depicted in 204, the movement of the proof masses due to self-test and the movement of the proof masses due to linear acceleration may be difficult to distinguish.

At 208, MEMS accelerometer 200 is shown with proof mass 210 and proof mass 212 moved out-of-phase about axis of rotation 220 in response to a self-test signal. Because proof masses 210 and 212 are offset with respect to the axis of rotation 220, they should normally rotate about the axis of rotation 220 in-phase as depicted at 204 and 206 in response to the in-phase external force imparted upon the proof masses. In the exemplary embodiment of 208 however, the self-test signals are applied to cause the proof masses to move contrary to their designed response to linear acceleration (e.g., respective self-test drive electrodes cause movements of the proof masses that are out-of-phase with respect to their designed motion due to linear acceleration). In this manner, as depicted at 230, the self-test and acceleration motions impart countervailing movements on the respective proof masses, which can be measured and extracted for independent processing as described herein.

FIGS. 3A-3D show exemplary MEMS accelerometer proof mass configurations for an in-plane MEMS accelerometer in accordance with some embodiments of the present disclosure. With reference to FIGS. 3A-3D, each figure shows MEMS accelerometer 300 including two proof masses (PM1 and PM2) and four sets of electrodes, with two sets of electrodes positioned adjacent to each respective proof mass. Each pair of electrodes includes an electrode with a positive polarity (a positive electrode) and an electrode with a negative polarity (a negative electrode). For example, a pair of self-test drive electrodes includes a positive self-test drive electrode and a negative self-test drive electrode, and a pair of sense electrodes includes a positive sense electrode and a negative sense electrode.

In continued reference to FIGS. 3A-3D, in some embodiments, two sets of the four sets of electrodes are self-test drive electrodes and a remaining two sets of the four sets of electrodes are sense electrodes. A first pair of sense electrodes is generally located adjacent to a first proof mass and a second pair of sense electrodes is generally located adjacent to a second proof mass. A first pair of self-test electrodes is generally located adjacent to a first proof mass and a second pair of self-test electrodes is generally located adjacent to a second proof mass.

In FIGS. 3A-3D, a positive sense electrode of the first pair of sense electrodes is generally positioned on a first adjacent side of the first proof mass in a first direction along an axis and a negative sense electrode of the first pair of sense electrodes is generally positioned on an adjacent side of the first proof mass opposite to the first adjacent side of the first proof mass, in a direction opposite to the first direction along the same axis. A positive sense electrode of the second pair of sense electrodes is generally positioned on a first adjacent side of the second proof mass in a first direction along an axis and a negative sense electrode of the second pair of sense electrodes is generally positioned on an adjacent side of the second proof mass opposite to the first adjacent side of the second proof mass, in a direction opposite to the first direction along the same axis.

Figures 3A, 3B, 3C, 3D:
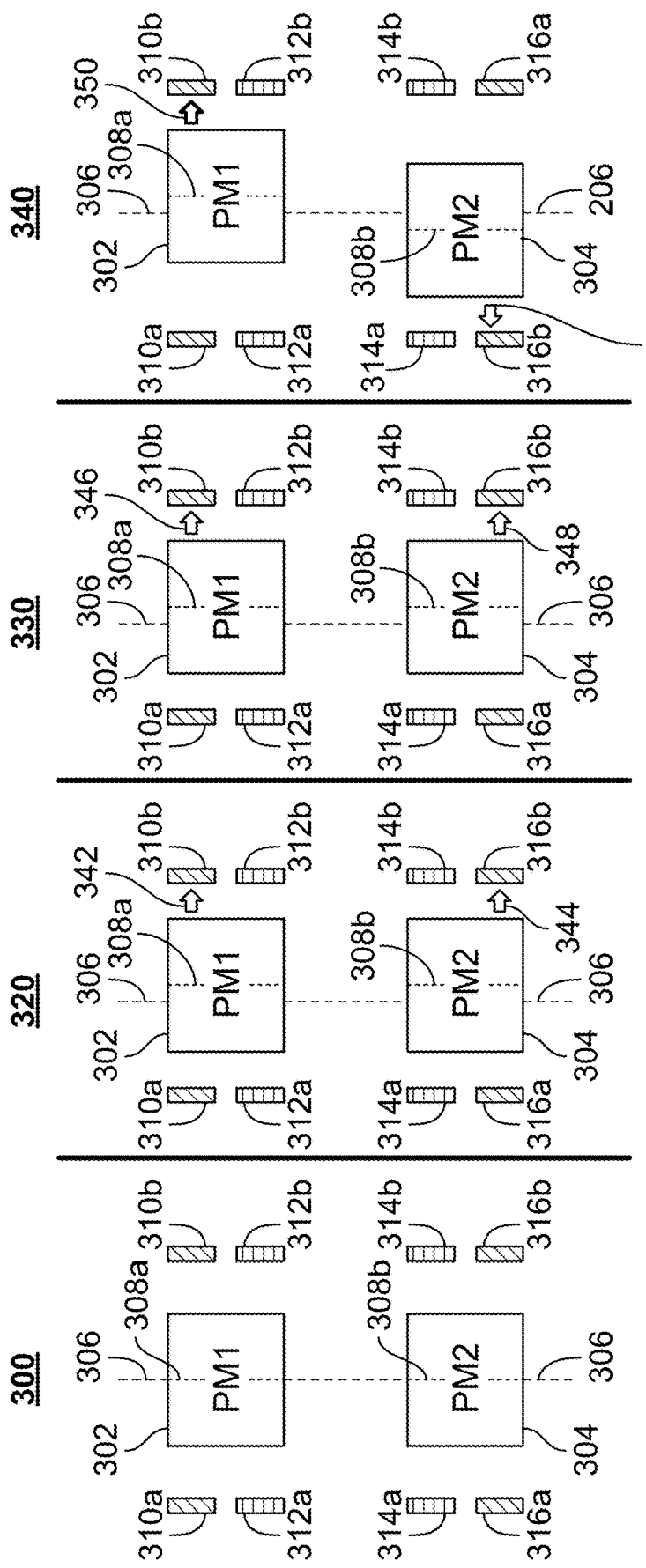
FIGS. 3A-3D depict exemplary MEMS accelerometer proof mass configurations for an in-plane MEMS accelerometer in accordance with at least some embodiments of the present disclosure.

In FIGS. 3A-3D, a positive self-test drive electrode of the first pair of self-test drive electrodes is generally positioned on a first adjacent side of the first proof mass in a first direction along an axis and a negative self-test drive electrode of the first pair of self-test drive electrodes is generally positioned on an adjacent side of the first proof mass opposite to the first adjacent side of the first proof mass, in a direction opposite to the first direction along the same axis. In some embodiments, the axis is in plane with a MEMS layer of MEMS accelerometer 300. In FIG. 3D, a positive self-test drive electrode of the second pair of self-test drive electrodes is generally positioned on an adjacent side of the second proof mass, at a side opposite to a like side of the first adjacent side of the first proof mass and a negative self-test drive electrode of the second pair of self-test drive electrodes is generally positioned on an adjacent side of the second proof mass, at a like side of the first adjacent side of the first proof mass. In FIG. 3D, the polarity of the second self-test drive electrode pair is opposite to the polarity of the first test drive electrode pair. Each pair of self-test drive electrode applies a self-test drive signal to a respective proof mass. In response to the application of the self-test drive signal to the first and second proof masses, the proof masses move out-of-phase relative to one another.

More specifically, as shown in each configuration of FIGS. 3A-3D, MEMS accelerometer 300 includes a proof mass (PM1) 302 and a proof mass (PM2) 304 and four sets of electrodes including a pair of self-test drive electrodes 310, a pair of sense electrodes 312, a pair of sense electrodes 314, and a pair of self-test drive electrodes 316. In each configuration, a first pair of sense electrodes and a first pair of self-test drive electrodes are generally located adjacent to proof mass 302 and a second pair of sense electrodes and a second pair of self-test drive electrodes are generally located adjacent to proof mass 304. Each pair of electrodes includes a positive electrode and a negative electrode. Self-test drive electrodes 310 includes a positive self-test drive electrode 310a and a negative self-test drive electrode 310b; sense electrodes 312 includes a positive sense electrode 312a and a negative sense electrode 312b; sense electrodes 314 includes a positive sense electrode 314a and a negative sense electrode 314b; and self-test drive electrodes 316 includes positive self-test drive electrode 316a and negative self-test drive electrodes 316b.

In FIGS. 3A-3C, all positive sense electrodes, 312a and 314a, and all positive self-test drive electrodes, 310a and 316a, are located adjacent to and on the left side of respective proof masses 302 and 304. Also in FIGS. 3A-3C, all negative sense electrodes, 312b and 314b, and all negative self-test drive electrodes, 310b and 314b, are located adjacent to and on the right side of respective proof masses 302 and 304. In FIG. 3D, self-test drive electrode 310a and positive sense electrode 312a are located adjacent to and on the left side of proof mass 302 and negative self-test drive electrode 310b and negative sense electrode 312b are located adjacent to and on the right side of proof mass 302. Positive sense electrode 314a is located on the left side and adjacent to proof mass 304 and negative sense electrode 314b is located on the right side and adjacent to proof mass 304. In contrast to FIGS. 3A-3C, in FIG. 3D positive self-test drive signal 316a is located on the right side of and adjacent to proof mass 304 and negative self-test drive signal 316b is located on the left side of and adjacent to proof mass 304. The polarity of self-test drive electrodes 316 is opposite to the polarity of self-test drive electrodes 310 in FIG. 3D.

Depending on the applied forces, each of the proof masses 302 and 304 of MEMS accelerometer 300 can move separately and distinctly relative to one other and in-phase and out-of-phase relative to a common axis. Differential sensing and common-mode sensing are performed based on the movements of proof masses 302 and 304. In an exemplary embodiment, differential sensing is performed in response to in-phase movements of the proof masses in a direction consistent with linear acceleration. Common-mode sensing is performed in response to out-of-phase movements of the proof masses.

In the configuration 310 of FIG. 3A, similar to a corresponding out-of-plane configuration at 202 of FIG. 2, proof masses 302 and 304 are static in the absence of any linear acceleration force, self-test force, or vibration. In the configuration 320 of FIG. 3B, similar to a corresponding out-of-plane configuration at 204 of FIG. 2, proof masses 302 and 304 move in-phase or in unison, as shown by arrows 342 and 344, respectively, in response to a linear acceleration, caused by application of a linear acceleration force ($F_{accel}$). In this configuration, differential sensing is performed in response to an in-phase proof mass movement in the presence of acceleration. The in-phase movement of proof masses 302 and 304 is along the linear acceleration direction. As proof mass 302 moves towards sense electrode and 312b and away from sense electrode 312a, the capacitance between proof mass 302 and sense electrode 312b increases while the capacitance between proof mass 302 and sense electrode 312a decreases. Similarly, as proof mass 302 moves towards sense electrode and 312b and away from sense electrode 312a, the capacitance between proof mass 302 and sense electrode 312b increases while the capacitance between proof mass 302 and sense electrode 312a decreases.

In the configuration 330 of FIG. 3C, similar to a corresponding out-of-plane accelerometer configuration at 206 in FIG. 2, differential sensing is achieved in response to the application of an in-phase self-test drive signal to self-test drive electrodes 310 and 316. In response to application of a common self-test drive signal to self-test drive electrodes 310 and 316 (e.g., with the positive polarity self-test drive electrodes 310a and 316a on the same side of the proof masses and the negative polarity and negative-test drive electrodes 310a and 316a on the opposite side of the proof masses), the self-test drive electrodes 310 and 316 cause movement of proof masses 302 and 304, respectively, in a manner similar to the manner in which acceleration causes movement of proof masses 302 and 304. Proof masses 302 and 304 move in-phase to an applied linear acceleration.

In the configuration 330, proof masses 302 and 304 move in unison toward respective negative sense electrodes and away from respective positive electrodes. Proof mass 302 moves toward negative sense electrode 312b while moving away from positive sense electrode 312a and proof mass 304 moves toward negative sense electrode 314b while moving away from positive sense electrode 314a. In this respect, the capacitance formed between proof mass 302 and negative sense electrode 312b increases, as does the capacitance formed between proof mass 304 and negative sense electrode 314b while the capacitance formed between proof mass 302 and positive sense electrode 312a decreases, as does the capacitance formed between proof mass 304 and positive sense electrode 314a. Accordingly, sense electrodes 312 and 314 respond in a similar manner to the in-phase self-test motion as they do to a response to linear acceleration.

In the configuration 340 of FIG. 3D, similar to a corresponding out-of-plane accelerometer configuration at 208 in FIG. 2, in response to a self-test drive signal, an out-of-phase self-test force is applied to proof masses 302 and 304 causing proof masses 302 and 304 to move out-of-phase, as shown by the opposite direction of movement of the proof masses by arrows 350 and 352, respectively. In the configuration 340 of FIG. 3D, the polarity of self-test drive electrodes 316 is flipped relative to the polarity of self-test drive electrodes 310 and the polarity of self-test drive electrodes of the configuration 330, causing out-of-phase movement of proof masses 302 and 304 and common-mode sensing due to the unchanged polarity of sense electrodes 314 relative to sense electrodes 312. Unlike the configuration 330, the motion of proof masses 302 and 304 are out-of-phase relative to the direction of acceleration.

As previously discussed, in the configuration 330, the capacitance formed between proof mass 302 and negative sense electrode 312b increases, as does the capacitance formed between proof mass 304 and negative sense electrode 314b. In 330, the capacitance formed between proof mass 302 and positive sense electrode 312a decreases, as does the capacitance formed between proof mass 304 and positive sense electrode 314a. Whereas, in the configuration 340, the opposite occurs in that proof mass 302 moves toward sense electrode 312b and away from positive sense electrode 312a while proof mass 304 moves toward positive sense electrode 314a and away from negative sense electrode 314b. The capacitance formed between proof mass 302 and negative sense electrode 312b increases while the capacitance formed between proof mass 304 and negative sense electrode 314b decreases. In the same manner, the capacitance formed between proof mass 302 and positive sense electrode 312a decreases while the capacitance formed between proof mass 304 and positive sense electrode 314a increases. Accordingly, in the configuration 330, the sense electrodes perform differential sensing in response to an in-phase self-test motion, and in the configuration 340, the sense electrodes perform common-mode sensing in response to an out-of-phase self-test motion.

FIG. 4A shows graphical representations 400 of an exemplary MEMS accelerometer self-test response with an in-phase self-test movement, in accordance with at least some embodiments of the present disclosure. FIG. 4B shows graphical representations 450 of an exemplary MEMS accelerometer self-test response with an out-of-phase self-test movement, in accordance with at least some embodiments of the present disclosure.

FIG. 4A shows a graphical representation 402 of an in-phase self-test drive signal applied to a MEMS accelerometer under test. Graphical representation 402 includes two self-test drive signals (ST1 and ST2), both shown, one overlaid by another, by 416. The self-test drive signals are active at a frequency common to the frequency of the self-test motion, as shown by the square wave shape portions of graph 416. Otherwise, the self-test drive signals are inactive as reflected at the flat portions of graph 416. The in-phase self-test drive signals, ST1 and ST2, are indistinguishable at graph 416. Graphical representation 402 further shows an acceleration (or vibration) signal at graph 418. The acceleration signal, at graph 418, has a sinusoidal shape in an exemplary embodiment. It is understood that for the purpose of simplicity, acceleration graph 418 is an approximated representation of vibration behavior, which may be any suitable pattern of acceleration applied to the MEMS accelerometer.

Graphical representation 404 shows a graph of the self-test operation output in response to the in-phase differential sensing of graph 402. The differential output 404 includes linear acceleration 420, superimposed by the self-test drive signal, shown as 426. Accordingly, the MEMS accelerometer self-test output and linear acceleration output interfere with each other at portions where both movements are active. A common mode output 406 in response to these linear acceleration signals does not have any output 422.

FIG. 4B shows graphical representations of a MEMS accelerator configuration similar to the configuration of FIG. 3D and configuration 208 of FIG. 2. More specifically, FIG. 4B shows a graphical representation 408 of an anti-phase self-test drive signal applied to a MEMS accelerometer under test, in accordance with various embodiments and methods of the disclosure. Graphical representation 408 includes two (anti-phase) self-test drive movements (ST1 and ST2), shown by signals 432 and 434, respectively. The self-test output signals are active at a common frequency during a self-test duration, shown by the square wave shape portions of graphs 434 and 432, and otherwise inactive during non-self-test durations, shown by the remaining flat portions of the signals. Graphical representation 408 further includes an acceleration signal at the self-test output signal, shown as signal 430. As shown by graphical representations 410 and 412, the linear acceleration signal and the self-test signals are both observable and distinct within the sense signal.

Graphical representation 410 shows a differential portion 436 of a sense signal in response to the combined movements depicted in 408. The differential signal 436 corresponds to the in-phase movement 430 of the proof masses in response to linear acceleration. In the exemplary embodiment of FIG. 4B, linear acceleration 430 and differential sense signal 436 are generally sinusoidal-shaped for ease of illustration, although it will be understood that an applied acceleration may have any suitable signal patterns and may not be periodic. As depicted in 410, the differential sense signal 436 corresponds only to the acceleration signal is therefore observable without interference by the self-test signal.

Graphical representation 412 shows a common mode portion 438 of a sense signal in response to the combined proof mass movements depicted in 408. A self-test output is generated in response to the MEMS accelerometer anti-phase self-test input (anti-phase proof mass movement). Signal 438 has a square wave shape portion corresponding to where the anti-phase self-test drive signal is active and is otherwise inactive, as shown by the flat portions of signal 438. Although particular self-test drive signal patterns are depicted in FIGS. 4A and 4B, it will be understood that a variety of other patterns (e.g., non-square wave signal patterns, non-periodic, pseudo-noise, CDMA, etc.) may be applied as self-test drive signals. In the exemplary embodiment of FIG. 4B, as depicted at 412, because the self-test drive signal is out-of-phase with the movement due to linear acceleration, the common mode portion 438 of the sense signal includes only the out-of-phase self-test signal 438, without interference from the in-phase (differentially sensed) linear acceleration signal.

Figure 5:
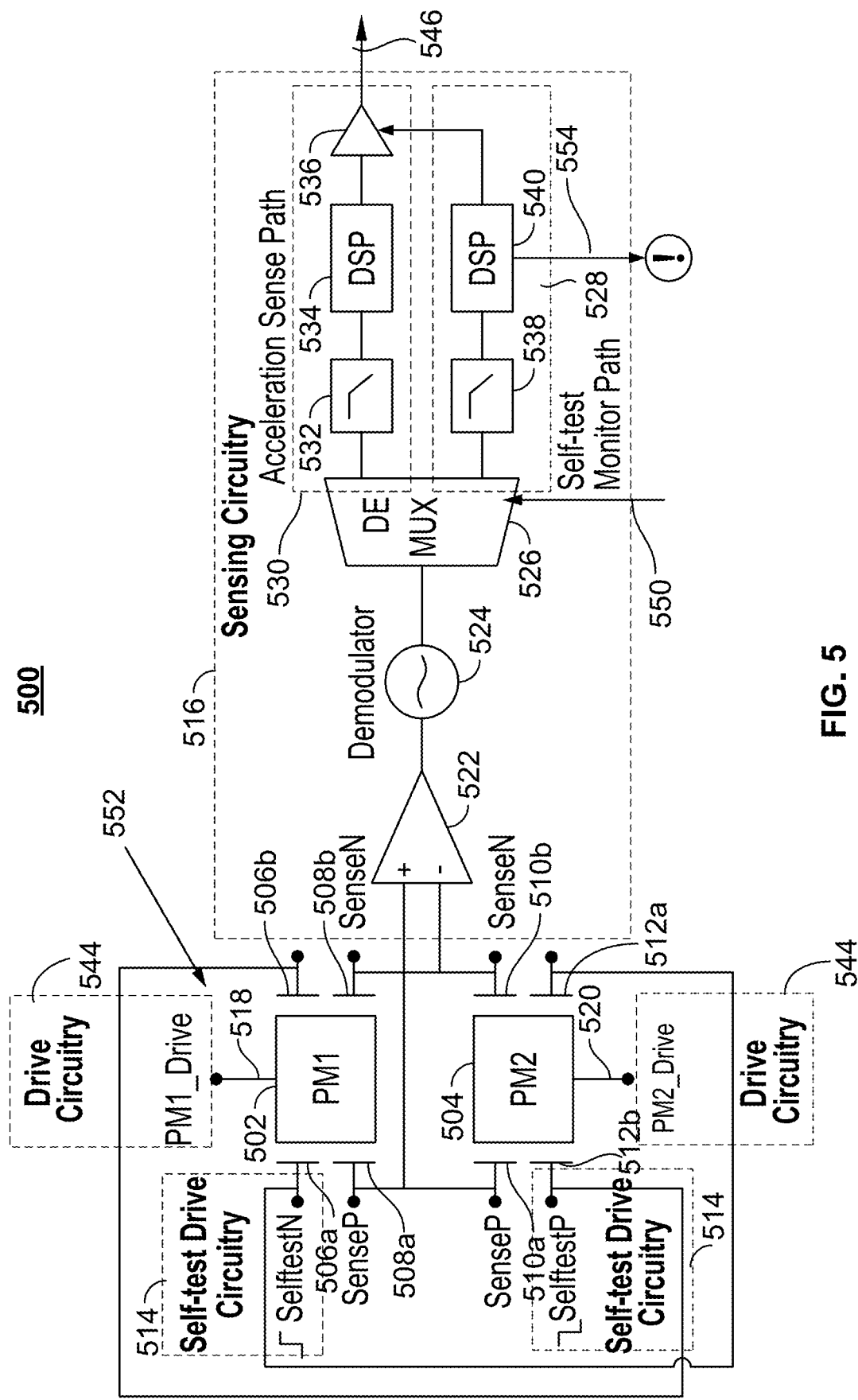
FIG. 5 depicts exemplary self-test and sensing circuitry in accordance with at least some embodiments of the present disclosure.

FIG. 5 depicts exemplary self-test and sensing circuitry in accordance with at least some embodiments of the present disclosure. The self-test and sensing circuitry of FIG. 5 may be configured, in part or in whole, as processing circuitry. In FIG. 5, an exemplary MEMS accelerometer including the self-test and sensing circuitry includes a proof mass 502 (PM1), a proof mass 504 (PM2), a pair of self-test drive electrodes 506, a pair of a sense electrodes 508, a pair of a sense electrodes 510, a pair of self-test drive electrodes 512, self-test drive circuitry 514, carrier drive circuitry 544, and sensing circuitry 516, in accordance with some embodiments of the disclosure. As previously noted, relative to preceding figures, each pair of sense electrode and each pair of self-test drive electrode includes a respective positive electrode and a respective negative electrode. Accordingly, self-test drive electrodes 506 include negative self-test drive electrode 506a and positive self-test drive electrode 506b; sense electrodes 508 include positive sense electrode 508a and negative sense electrode 508b; sense electrodes 510 include positive sense electrode 510a and negative sense electrode 510b; and self-test drive electrodes 512 include positive self-test drive electrodes 512a and negative self-test drive electrodes 512b.

PM1 and PM2 move in-phase in response to a sensed linear acceleration. As described herein (e.g., based on the respective polarity and location of the applied self-test drive signals), self-test drive circuitry 514 causes an out-of-phase movement onto PM1 and PM2. In the exemplary embodiment of FIG. 5, the motion of PM1 and PM2 in response to the linear acceleration and the self-test movement is sensed as a sense signal on a shared set of sense electrodes, and thus, is effectively multiplexed on the sense signal. Processing circuitry extracts from the sense signal a linear acceleration signal corresponding to the in-phase movement due to linear acceleration and a self-test sense signal corresponding to the out-of-phase movement due to the self-test drive signal.

Sense electrodes 508a and 508b are located adjacent to and on either side of PM1, in a manner similar to sense electrodes 312a and 312b, respectively, of configuration 340 of FIG. 3D. Sense electrodes 510 are located adjacent to and on either side of PM2, in a manner similar to sense electrodes 314a and 314b, respectively, of configuration 340 of FIG. 3D.

Self-test drive circuitry 514 is shown to generate SelftestN (drive) and SelftestP (drive) signals. Carrier drive circuitry 544 is shown to include PM1_Drive and PM2 Drive signals. Sensing circuitry 516 is shown to include a C2V 522, a demodulator 524, a demultiplexer 526, a self-test monitor path 528, and an acceleration sense path 530. Self-test monitor path 528 is shown to include a self-test filter 538 and a self-test digital signal processor (DSP) 540. Acceleration sense path 538 is shown to include an acceleration filter 532, an acceleration DSP 534, and a gain/offset/sensitivity (GOS) block 536.

PM1, PM2, self-test drive electrodes 506, sense electrodes 508, sense electrodes 510 and self-test drive electrodes 512 may collectively form a MEMS accelerometer 552, an example of a MEMS sensor product undergoing real time and continuous self-test monitoring during the product operational lifetime, in accordance with various disclosed embodiments and methods. MEMS accelerometer 552 includes a MEMS layer including a suspended spring-mass system including proof masses that move with respect self-test drive electrodes 506, sense electrodes 508, sense electrodes 510 and self-test drive electrodes 512.

In some embodiments, in-phase movement of PM1 and PM2 includes simultaneous movement of the proof masses toward all the positive sense electrodes or all the negative sense electrodes. An in-phase movement example is a PM1 and a PM2 simultaneous movement toward an electrode of each of the electrodes 506, 508, 510 and 512 with a common polarity. The out-of-phase movement of PM1 and PM2 includes movement of one of the proof masses, either PM1 or PM2, in a direction toward a corresponding positive sense electrode (at an adjacent side) of the proof mass and simultaneous movement of the other proof mass in a direction toward a corresponding negative sense electrode (an adjacent opposite side) of the proof mass.

As shown in the embodiment of FIG. 5, self-test drive circuitry 514 is coupled to PM1 and PM2 through the SelftestN and SelftestP drive signals, the negative and positive polarities of a "self-test drive signal", respectively.

In FIG. 5, SelftestN drive signal is shown coupled to self-test drive electrode 506a and to self-test drive electrode 512a and SelftestP drive signal is shown coupled to self-test drive electrode 506b and self-test drive electrode 512b. The SelftestN and SelftestP drive signals are applied at opposite sides to PM1 and PM2, therefore, self-test drive circuitry 514 causes PM1 and PM2 to move out-of-phase. More specifically, the negative polarity of self-test drive signal, SelftestN signal, is applied to positive self-test drive electrode 506a adjacent to PM1 and to positive self-test drive electrode 512a adjacent to PM2 while the positive polarity of self-test drive signal, SefltestP signal, is applied to negative self-test drive electrode 512b adjacent to PM2 and to negative self-test drive electrode 506b adjacent to PM1. The polarities of the self-test drive electrodes 506 and 512 are opposite to cause an out-of-phase proof mass movement. But because the polarity of sense electrodes 508 and 510 are not in opposite, the sensing of the out-of-phase movement is common mode.

The sensed movements of the proof masses are represented as capacitance changes between the proof masses and respective sense electrodes based on an in-phase and an out-of-phase movement of PM1 and PM2. As earlier noted, this dual motion feature of PM1 and PM2 is effectively multiplexed in the form of combined sense signal include a linear acceleration signal and a self-test signal, implementing a design architecture with fewer circuit components and lower power consumption. In other embodiments (not depicted in FIG. 5), a second C2V amplifier similar to 522 may be connected for common mode sensing.

Sensing circuitry 516 is coupled to MEMS accelerometer 552 at the proof mass outputs through the SenseP and SenseN signals of self-test drive circuitry 514. SenseP signal is coupled to sense electrodes 510a and 508a and SenseN signal is coupled to sense electrodes 510b and 508b. In some embodiments, a capacitance to voltage (C2V) converter 522 of processing circuitry 516 is a differential amplifier coupled, at a positive input, to the combined SenseP signal, and at a negative input, to the combined SenseN signal. In response to changes in the SenseN and SenseP signals, C2V 522 generates a differential output, represented by a sense signal, that is detected by sensing circuitry 516.

More specifically, C2V 522 generates the sense signal based on the differential inputs of the SenseN and SenseP signals, with embedded linear acceleration and self-test signals that are subsequently demultiplexed into two distinct signals, such as shown at graphs 410 and 412, of FIG. 4B, respectively. As earlier described, the self-test output signal is generated in response to an out-of-phase movement of PM1 and PM2 and the linear acceleration signal is generated in response to the in-phase movement of PM1 and PM2.

In the embodiment of FIG. 5, C2V 522 is configured as a capacitance-to-voltage C2V) converter. The capacitance measured based on the movements of PM1 and PM2 relative to respective sense electrodes, is converted to a proportional voltage by the C2V converter and further processed by the processing circuitry of FIG. 5.

During the MEMS accelerometer in-field operation of the exemplary processing circuitry of FIG. 5, a relative in-phase proof mass movement causes differential sensing and a relative out-of-phase proof mass movement causes common-mode sensing. During PM1 and PM2 in-phase movement, for example, PM1 is caused to move to the right toward a respective sense electrode located to the right of PM1, and PM2 is made to simultaneously move to the right toward a respective adjacent sense electrodes located to the right of PM2, such as shown by the direction of movement of PM1 and PM2 in FIG. 3B. This in-phase movement has the effect of increasing the capacitance between each proof mass and a respective electrode positioned to the adjacent right of the proof mass in response to a force (e.g., linear acceleration) applied to the proof mass. More specifically, the capacitance between PM1 and sense electrode 508b increases while the capacitance between PM1 and sense electrode 508a decreases, and the capacitance between PM2 and sense electrode 510b increases while the capacitance between PM2 and sense electrode 510a decreases. The in-phase proof mass movement simultaneously decreases the capacitance between each proof mass and a respective electrode positioned to the adjacent left of the proof mass.

A relative out-of-phase movement of PM1 and PM2, for example, PM1 moving toward sense electrode 508b and away from sense electrode 508a and PM2 moving toward sense electrode 510a and away from sense electrode 510b, is shown by the direction of the arrows 350 and 352 associated with PM1 and PM2 in FIG. 3D, respectively, and results in common-mode sensing in the exemplary configuration of FIG. 5. That is, in response to the proof mass self-test drive signal (SelftestP signal and SelftestN signal) applied to self-test drive electrodes 506a and 506b, PM1 moves closer to sense electrode 508b and the capacitance between PM1 and sense electrode 508b increases while the capacitance between PM1 and sense electrode 508a decreases. In the meanwhile, in response to the proof mass self-test drive signal applied to self-test drive electrodes 512a and 512b, PM2 moves closer to sense electrode 510a and the capacitance between PM2 and sense electrode 510a increases while the capacitance between PM2 and sense electrode 510b decreases.

In an exemplary embodiment, the PM1_Drive and PM2_Drive signals are periodic carrier signals. In some embodiments, the PM1_Drive and PM2_Drive signals have a common frequency. In some embodiments, the PM1_Drive and PM2_Drive signals are in phase and a frequency of the PM1_Drive and PM2_Drive signals is a multiple of a frequency of the other one of the PM1_Drive and PM2_Drive signals. In the examples to follow, the PM2_Drive signal is presumed to have a frequency twice that of the frequency of the PM1_Drive signal. As earlier noted, embodiments with drive signals of different frequencies facilitate separating differential sensing from common-mode sensing and can possibly be effective power consumption measures.

PM1_Drive and PM2_Drive signals are similar to the SelftestN and SelftestP signals in that both sets of signals are drive signals, but unlike the SelftestN and SelftestP signals, each of the PM1_Drive and PM2_Drive signals acts as a respective carrier of the linear acceleration signal and the self-test signal, illustrative by the example graphs of FIGS. 6-9. Additionally, unlike the SelftestN and SelftestP signals, the PM1_Drive and PM2 Drive signals do not cause physical movement of the proof masses PM1 and PM2.

Demodulator 524 receives the sense signal, output of C2V 522, and demodulates the sense signal to remove the carriers, PM1_Drive and PM2 Drive_signals, outputting the raw sense signal due to proof mass movement (e.g., including embedded linear acceleration signal and self-test signals) for further processing.

Although not depicted in FIG. 5, in some embodiments the processing circuitry of FIG. 5 may include additional circuitry such as an analog-to-digital converter (ADC) for digitizing the analog signals generated by C2V 522 or other as processed by other subsequent circuitry. For example, an ADC may be implemented between demodulator 524 and demultiplexer 526, or between demultiplexer 526 and each of acceleration sense path 530 and self-test monitor path 528, or in each of acceleration sense path 530 and self-test monitor path 528.

Demultiplexer 526 extracts the linear acceleration signal and the self-test (output) signal from the sense signal, for example, by selectively outputting the differential and common-mode components of the combined sense signal. Demultiplexer 526 may output the linear acceleration signal onto accelerometer sense path 530 (e.g., at particular time periods associated with a demux clock 550) and output the self-test signal onto self-test monitor path 528 (e.g., at other particular time periods associated with the demux clock 550). In the graphs of FIGS. 6-9, to follow, during the negative (or low) periods of the demux clock cycles, the linear acceleration signal is extracted onto self-test monitor path 528 and during the positive (or high) periods of the demux clock cycles, the self-test signal is extracted onto accelerometer sense path 530. It is understood that alternatively, the self-test signal and the linear acceleration signals may be extracted at opposite half clock periods. It is also understood that references to a particular polarity and polarity coupling herein are merely example polarities and opposite polarities and polarity couplings is contemplated.

In some embodiments, self-test filter 538 of self-test monitor path 528 is configured as a low pass filter to remove noise caused by frequency harmonics that may be associated with sampling among other causes. Analogously, acceleration filter 532 of acceleration sense path 530 is configured as a low pass filter for a similar reason. It is understood that filters 532 and 538 may each be a suitably different type of filter. Each of DSPs 534 and 540 digitally processes respective filtered outputs from filters 532 and 538. In some embodiments, DSP 540 generates a sensor health monitor output 554, in common-mode sensing, in response to detection of a degraded component or component feature, for example. In a nonlimiting example, output 554 may identify errors from the measured sensitivity based on absolute changes (e.g., compared to a baseline) or changes over time (e.g., abrupt changes in sensitivity).

In some embodiments, the outputs of DSPs 540 and 534 are received by GOS block 536. The gain, offset, and scaling parameters of GOS block 536 collectively modify the measured value based on characteristics of the MEMS accelerometer. The output of GOS block 536 generates signal 546 corresponding to a sensed linear acceleration, which may be further processed by other analog and/or digital processing circuitry.

In some embodiments, any of the self-test drive signal pattern and/or the acceleration signal may correspond to code-division multiple access (CDMA) signals to further assist in distinguishing self-test and acceleration signals, for example, as is described in commonly owned U.S. patent application Ser. No. 16/874,418, filed on May 14, 2020, and entitled "MEMS SENSOR MODULATION AND MULTIPLEXING", which is incorporated by reference as though set forth in full herein.

In some embodiments, the self-test (output) signal may be recovered from the sense signal with other implementations. For example, notch filters may notch the signal at the self-test signal frequency. In some embodiments, the processing circuitry may include a second C2V where one C2V, for example, amplifier 522, performs differential sensing exclusively and at all times and another C2V, simultaneously performs common-mode sensing exclusively and at all times. In this configuration, a demultiplexer is not needed because the linear acceleration signal and the self-test signal are separated at sensing, not embedded in a common sense signal.

FIGS. 6-9 show exemplary signals at different stages of self-test and sensing circuitry, in response to different applied linear acceleration and self-test signals. Each of the figures of FIGS. 6-9 includes six graphs, a graph of a PM1 signal (PM1_Drive in FIG. 5) and a PM2 signal (PM2_Drive in FIG. 5), a C2V output graph, a demodulated signal graph, a demux clock graph, a linear acceleration signal graph, and a self-test signal graph. Further, in each figure, the PM2 signal is presumed to have a frequency twice that of the frequency of the PM1 signal. In the first graph of each of the FIGS. 6-9 (top-most graph), "PM1" represents the signal behavior of PM1_Drive of FIG. 5 and "PM2" represent the signal behavior of PM2_Drive of FIG. 5. Each of the PM1 and PM2 signals is presumed a square wave shaped periodic signal. It is understood that each of signals PM1 604 and PM2 602 may have a suitably different signal shape. PM1 and PM2 are further presumed to have opposite polarity relative to one another and the frequency of PM2 is presumed twice the frequency of PM1. In each figure, the first (top) graph shows PM1 with a solid line and PM2 is shown with a dashed line.

In each of FIGS. 6-9, the horizontal axis represents time in milliseconds (ms) and the vertical axis represents a range of normalized signal amplitude values. In each figure, a time range is shown on the horizontal axis from 0 ms to 0.05 ms in 0.005 ms intervals. Signal amplitude ranges are shown on the vertical axis and vary based on the signal. For example, at graph 610, the signal amplitude ranges may vary across figures and across graphs of a figure. Graph 610 of FIG. 6 and graph 910 of FIG. 9 both show a graph of PM1 and PM2 yet in FIG. 6, the signal amplitude ranges from −0.1 to +0.1 and in FIG. 9, the signal amplitude ranges from −0.2 to +0.2 and at graph 610, the signal amplitude range is −0.1 to +0.1 while at graph 620, the signal amplitude range is 0.2 to +0.2.

In a second top-most graph of each figure, "C2V output", a graph of the output of C2V 522 (sense signal) is shown; the third top-most graph of each figure is a graph of the output of demodulator 526; the fourth top-most graph of each figure is a graph of the demux clock 550; the fifth top-most graph of each figure is a graph of the linear acceleration signal (extracted from the sense signal in FIG. 5); and the last graph of each figure is a graph of the self-test (output) signal (extracted from the sense signal in FIG. 5).

Figure 6:
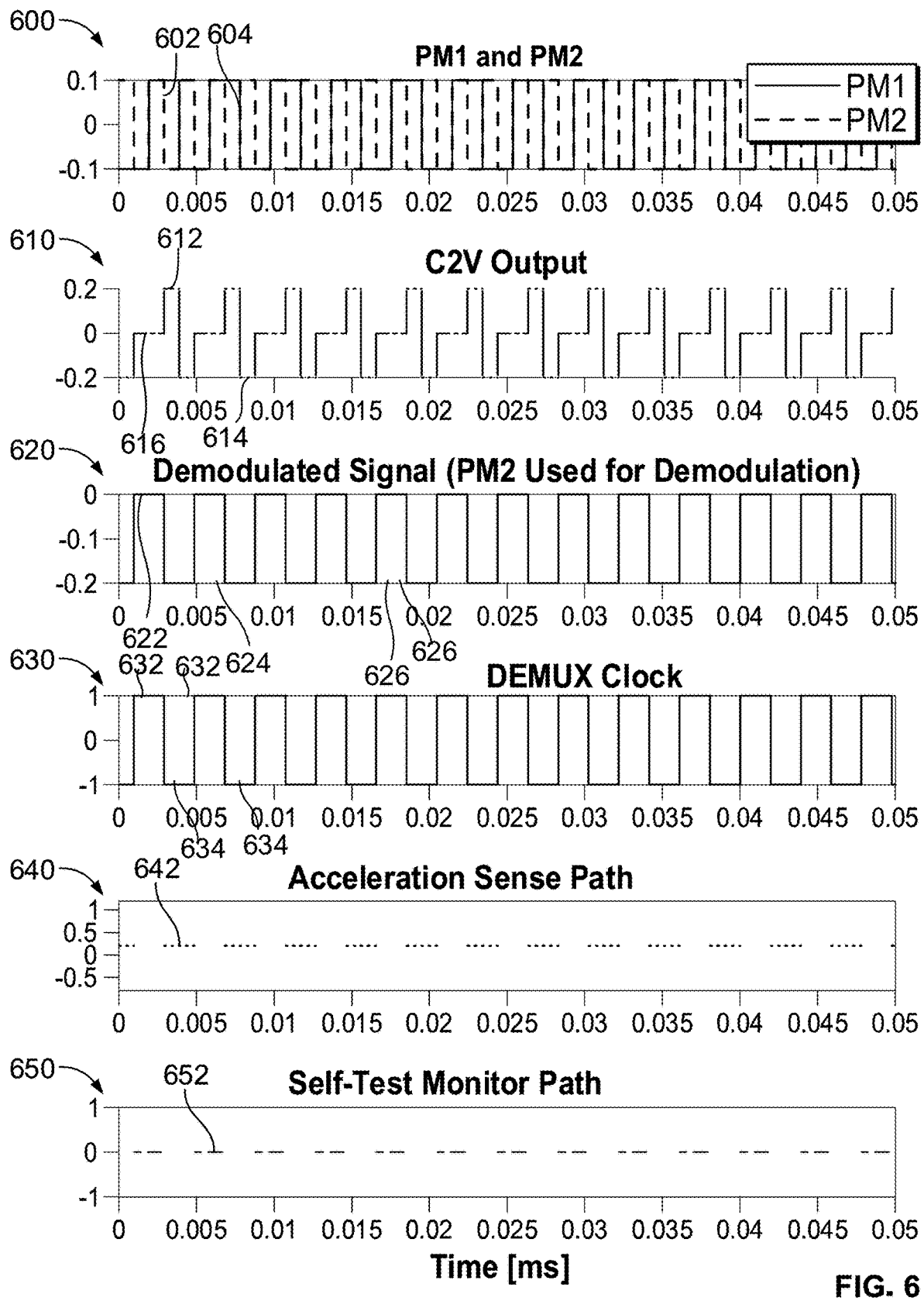
FIG. 6 depicts exemplary signals at different stages of self-test and sensing circuitry when no force is applied to MEMS accelerometer proof masses, in accordance with at least some embodiments of the present disclosure.

In the exemplary embodiment depicted in FIG. 6, the MEMS accelerator 552 proof masses (proof mass 502 and proof mass 504 of FIG. 5, for example) are static and not in motion either due to linear acceleration or a self-test motion. Accordingly, the proof mass 502 output and the proof mass 504 output are not modulated by a self-test signal or an acceleration signal.

With continued reference to FIG. 6, at graph 610 (output of C2V 522), during the periods when PM1 604 is high and PM2 602 is low or vice versa, the output of C2V 522 is at a maximum high (shown at 612 of graph 610), +0.2, and a maximum low (shown at 614 of graph 610), −0.2, respectively, a differential of 0.1 and −0.1, i.e., +0.1 minus (+0.1) =+0.2, and −0.1 minus (−0.1)=−0.2, respectively. Because PM2 602 has double the frequency of PM 604, where PM1 604 and PM2 602 have the same amplitude (both are at −0.1 or both are at +0.1), the net output is zero, as shown at 616 of graph 610. Accordingly, graph 610 is made of two essential portions, a differential portion where the frequency of PM2 602 is double that of PM1 604 and graph 610 is 0, at 616, common-mode carrier, and another portion where the C2V output is a differential output at 612 and 614, a differential carrier.

The output of C2V 522 is demodulated (by demodulator 524) with PM2 602 to generate a demodulated signal with behavior shown by graph 620. Where PM2 602 is high (at 0.1) and graph 610 is at 0 (shown at 616), the demodulated signal is at high (at 0), as shown by 622 at graph 620, where PM2 602 is low and graph 610 is at +0.2, graph 620 is low, shown at 624, at graph 620, and where PM2 602 is high or low and graph 610 is at 0, graph 620 is at high, as shown at 626 at graph 620. Graph 630 shows the behavior of the demux clock 650. At high half periods of demux clock 650, shown at 632 of graph 630, acceleration signal 642, at graph 640, is output by demux 626 and at low half periods of demux clock 650, shown at 634 of graph 630, self-test signal 652, at graph 650, is output by demux 626. Both the acceleration signal 642 and self-test signal 652 are flat at 0, due to the inactivity of proof masses 502 and 504.

Figure 7:
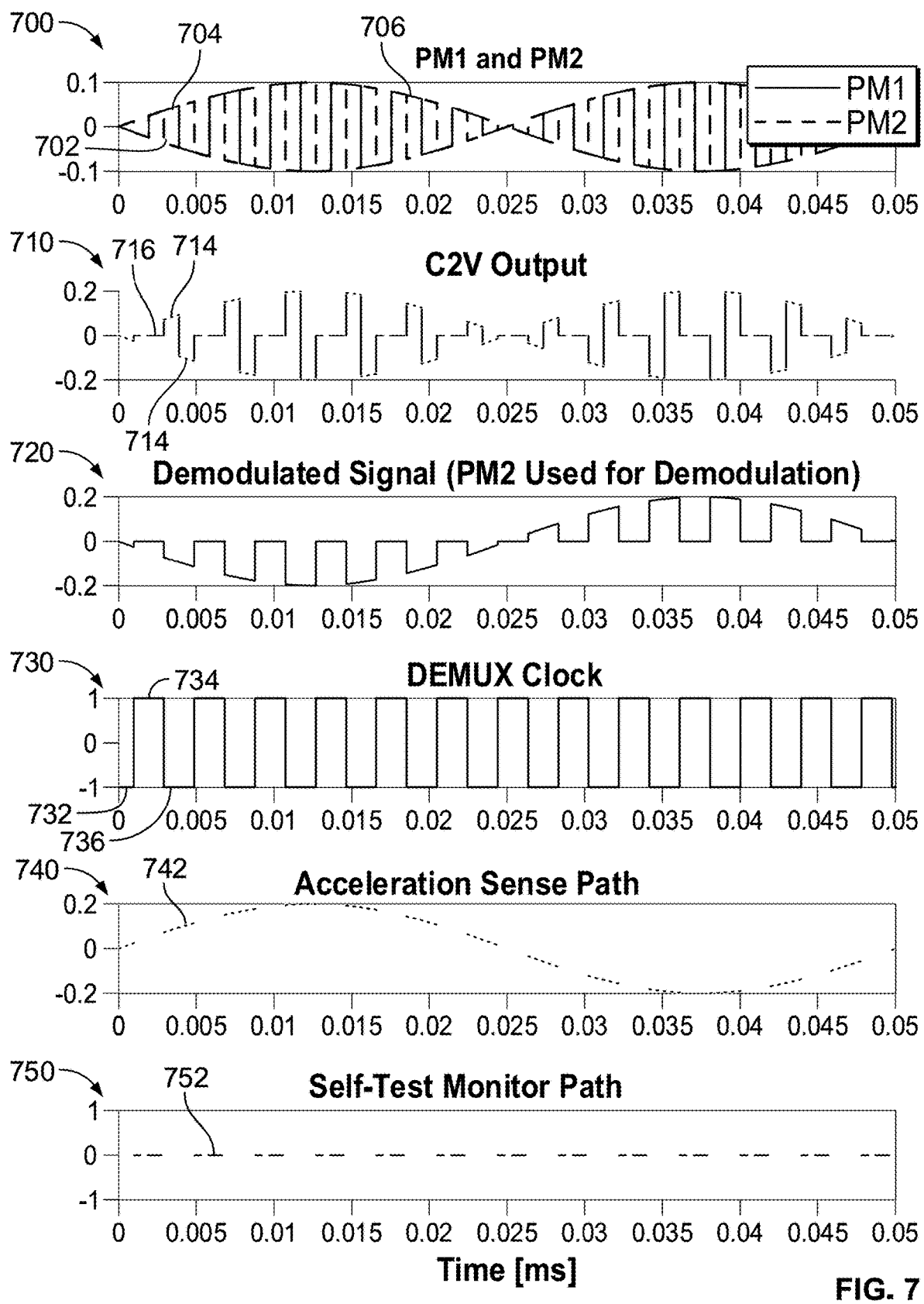
FIG. 7 depicts exemplary signals at different stages of self-test and sensing circuitry in response to a linear acceleration applied to MEMS accelerometer proof masses, in accordance with at least some embodiments of the present disclosure.

In FIG. 7, the proof mass 502 and proof mass 504 movements are consistent with the movement of the MEMS accelerometer due to linear acceleration and sensing is performed on the differential path, path 530 in FIG. 5. A (linear) accelerometer signal 706, shown at graph 700, modulates both PM1 704 and PM2 702 and the way the signals add together in response to an in-phase movement of proof masses 502 and 504. Accordingly, PM1 704 and PM2 702, proof mass 502 and proof mass 504 outputs, respectively, move together, enveloped in the same envelope of accelerometer signal 706. When the frequencies of PM1 704 and PM2 702 align, their sums are differential values, as shown at 714 of graph 710. When PM1 704 and PM2 702 overlap, their sum is 0, as shown at 716 of FIG. 710. The amplitude of the differential portions of C2V 522 change in accordance with the amplitude of accelerometer signal 706, an enveloped amplitude change. The demodulated C2V output with PM2 702 is shown at graph 720. As shown by graph 720, the demodulation output follows the amplitude of acceleration signal 706. Demux clock 550, shown at graph 730, switches between a differential output, shown at graph 740 and a common-mode output, shown at graph 750. The common-mode output—the sensed self-test signal—has a value of 0 because no self-test signal is applied in the configuration of FIG. 7 and the differential output is the sensed acceleration signal as shown at graph 740.

Figure 8:
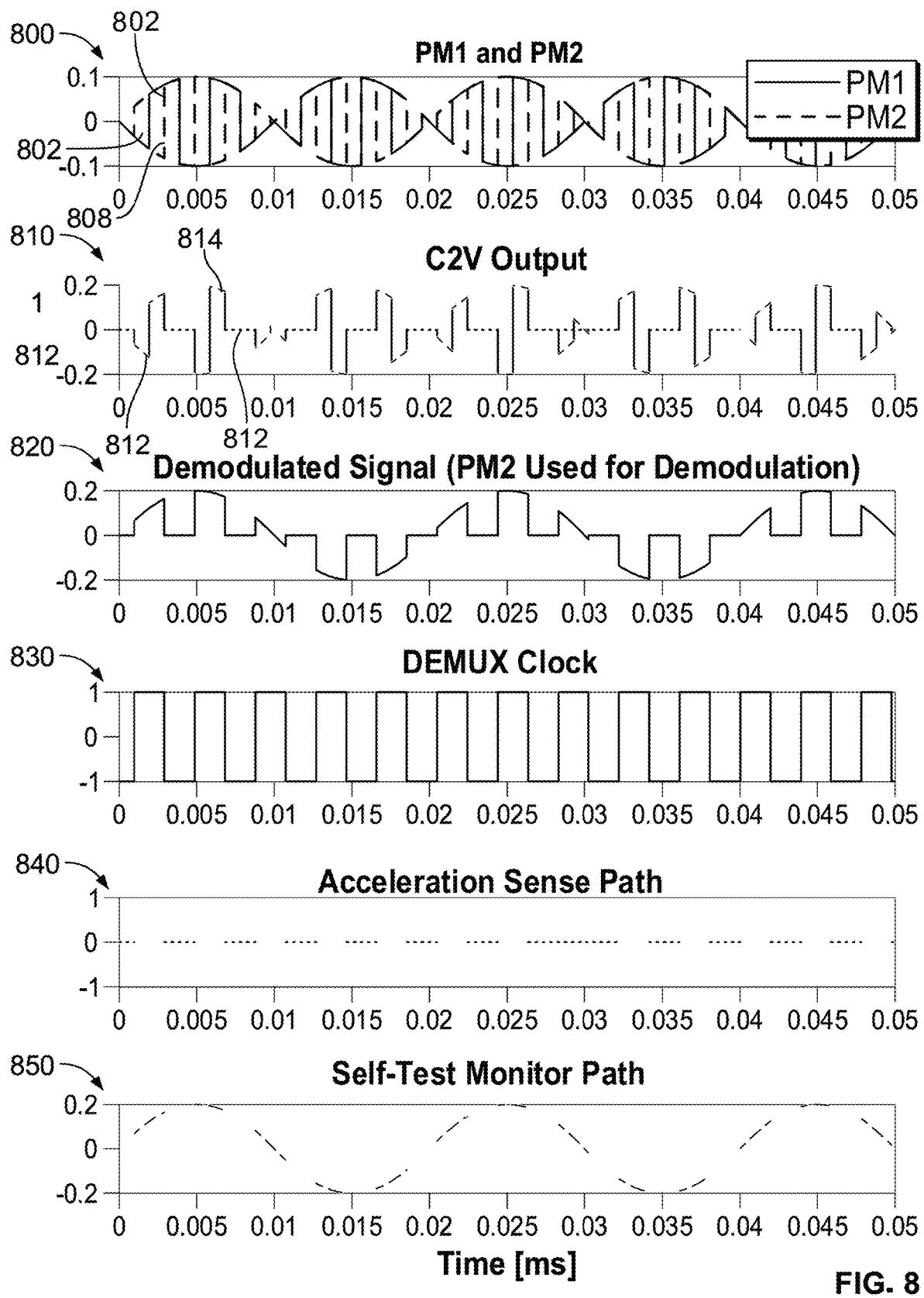
FIG. 8 depicts exemplary signals at different stages of self-test and sensing circuitry in response to an out-of-phase self-test force applied to MEMS accelerometer proof masses, in accordance with at least some embodiments of the present disclosure.

FIG. 8, a self-test only (no acceleration) configuration, proof masses 502 and 504 are moved out-of-phase. Therefore, sensing is performed on the common-mode path, path 528, and not the differential path, path 530. Whereas if the movement of the two proof masses were in the same direction as the linear acceleration, such as shown and discussed relative to FIG. 7, sensing is performed on the differential path.

In FIG. 8, PM1 804 and PM2 802 (shown at graph 800) have the same frequency but their movements are lined up differently because the self-test drive signals force proof masses 502 and 504 to move in opposite directions. Accordingly, at the output of C2V 522, shown by graph 810, the differential parts of graph 810 become 0, as shown at 812, and the common-mode parts of graph 810, show the PM1 804 and PM2 802 differences, as shown at 814. Accordingly, on path 530, no signal is observed, as shown at graph 840, and on the self-test path, path 528, the self-test movement is observed, as shown at graph 850.

Figure 9:
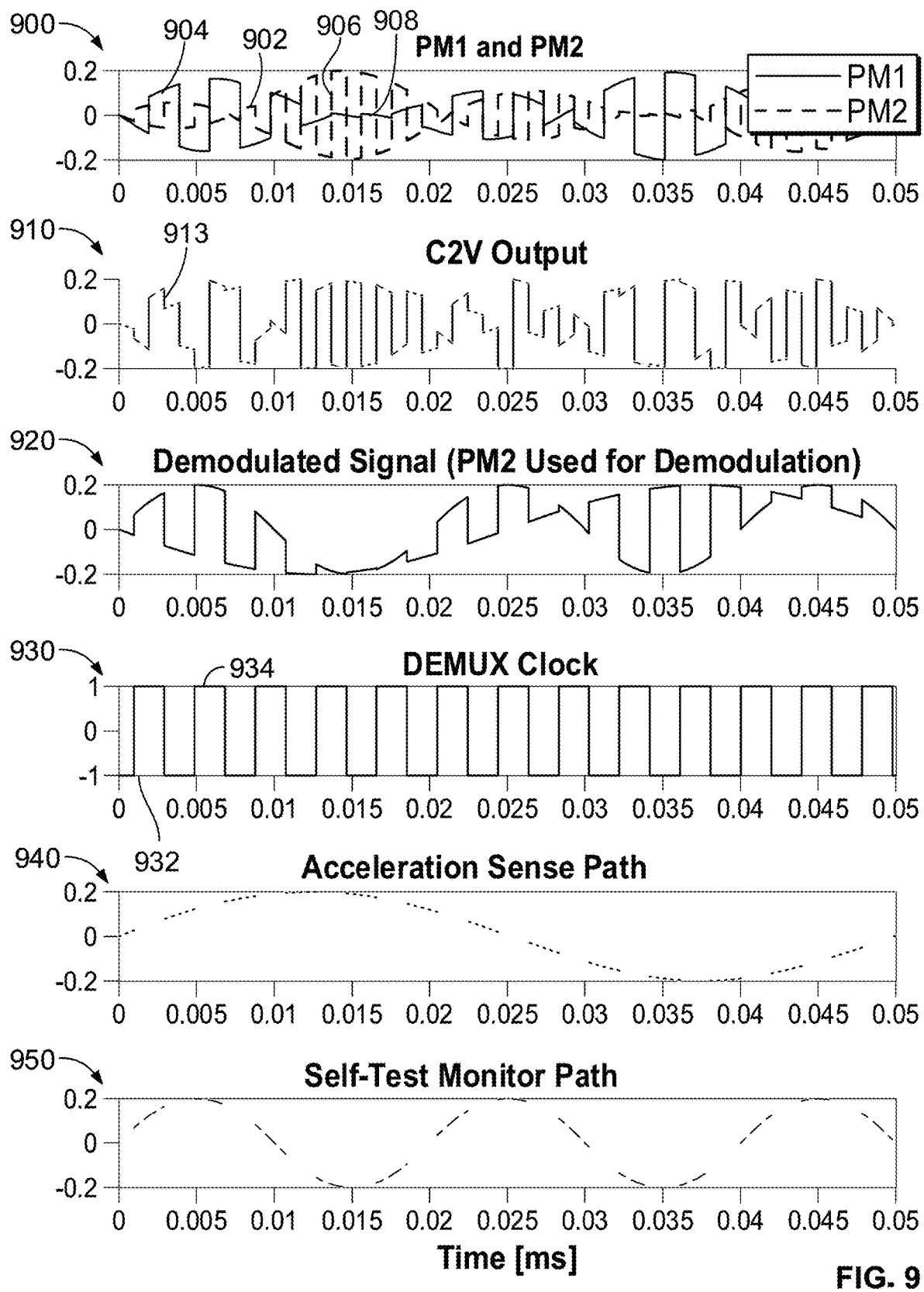
FIG. 9 depicts exemplary signals at different stages of self-test and sensing circuitry in response to both a linear acceleration and an out-of-phase self-test force applied to MEMS accelerometer proof masses, in accordance with at least embodiments of the present disclosure.

In the configuration of FIG. 9, the acceleration and the self-test signals are both present. With reference to graph 900, where PM2 902 is periodic but with a small magnitude, acceleration moves one of the proof mass (of proof masses 502 and 504) in a first direction but while acceleration attempts to move the remaining proof mass in the same direction, the self-test signal forces the remaining proof mass to move in a direction opposite to the direction of the acceleration movement (or the direction of the other proof mass movement) by a displacement amount smaller than the displacement amount the first proof mass moves the direction of acceleration. Accordingly, while the periodic self-test movement exist, but it is at a smaller amplitude amount because it is in a direction opposite to the acceleration movement direction. Therefore, when the self-test movement and acceleration movement are both present, both proof masses 502 and 504 move at a location very close to a corresponding sense electrode and the varying small magnitude signal to a large magnitude signal effect results in PM2 902, as shown at graph 900. The large magnitude parts of PM2 902, as shown at 906, show the behavior of PM2 902 when acceleration and self-test move together. At the same time, the magnitude of PM1 904 decreases significantly because self-test is working against acceleration, as earlier explained, shown at 908. The demodulated signal follows the amplitude envelope of PM2 902, as shown at graph 920. At half periods 932 (of graph 930) of demux clock 550, acceleration data is acquired. The behavior of the acquired acceleration data is shown at graph 940. During other half periods 934 of demux clock 550, self-test data is acquired with the behavior of the acquired self-test data shown at graph 950. Demultiplexer 526 can extract the two types of data because they are out-of-phase relative to one another.

Figure 10:
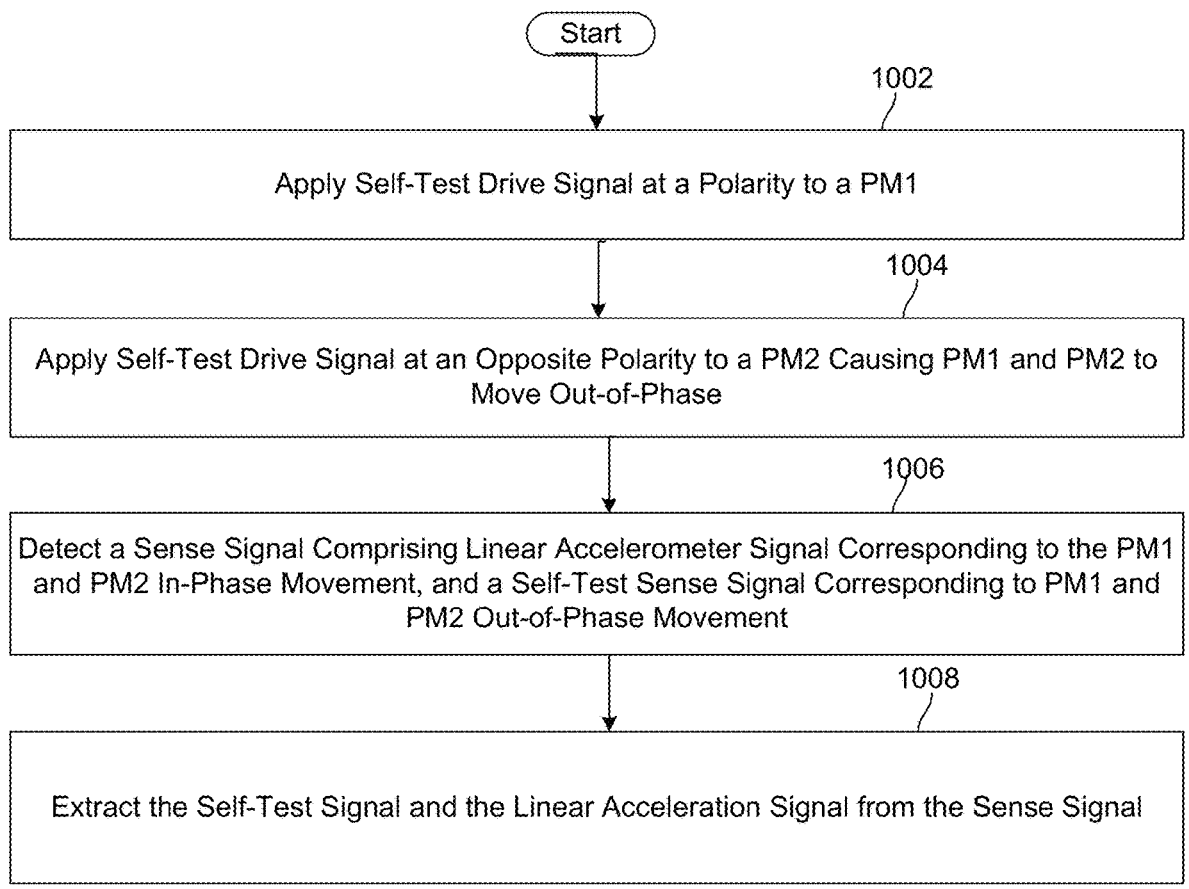
FIG. 10 illustrates steps of an exemplary MEMS accelerometer self-test process in accordance with at least embodiments of the present disclosure.

FIG. 10 depicts exemplary steps for self-test operation of an exemplary MEMS accelerometer in accordance with at least some embodiments of the present disclosure. Although FIG. 10 is described in the context of the particular structures and components of the present disclosure, it will be understood that the methods and steps described in FIG. 10 may be applied to a variety of MEMS accelerometer designs, self-test techniques, processing circuitry, and compensation techniques. Although a particular order and flow of steps is depicted in FIG. 10, it will be understood that in some embodiments one or more of the steps may be modified, moved, removed, or added, and that the flow depicted in FIG. 10 may be modified.

The self-test operation of FIG. 10 is described with reference to the processing circuitry of FIG. 5 for the benefit of simplicity. It is understood that alternate processing circuitry suitable for carrying out the steps of FIG. 10 may be employed. At step 1002 of the self-test operation, a self-test drive signal, at a first polarity, is applied to a first proof mass. For example, in FIG. 5, SelftestN and SelftestP signals are applied to PM1 at a certain polarity. Simultaneously, at step 1004, the self-test drive signal is applied at a polarity opposite to the first polarity to a second proof mass. For example, a SelftestN/SelftestP polarity is presumed applied to PM1, a SelftestP/SelftestN polarity is presumed applied to PM2. In response to applying the self-test drive signal to PM1 and PM2, a sense signal is generated. At step 1006, the sense signal is detected. For example, the sense signal may be generated by C2V 522 and detected at the output of C2V 522. The sense signal has two embedded signals, each is a function of a distinct PM1-PM2 movement. That is, the detected sense signal carries a linear acceleration signal in response to a PM1 and PM2 in-phase movement and a self-test output signal in response to a PM1 and PM2 out-of-phase movement. Next, at step 1008, the linear acceleration signal and the self-test (sense) signals are extracted from the sense signal. For example, demultiplexer 526 outputs the linear acceleration signal at first half periods of demux clock 550 cycles and outputs the self-test sense signal at second half periods of the demux clock 550 cycles. The linear acceleration signal may be further processed by the acceleration sense path components and the self-test signal is further processed by the self-test monitor path components as earlier discussed and shown relative to preceding figures. The foregoing description and FIG. 10 describe a self-test operation in accordance with the implementation of FIG. 5. In alternate implementations where two C2Vs are employed, one for acceleration sensing and another for self-test sensing, the sense signal is two distinct signals, each generated by a distinct C2V, alleviating the need for a demultiplexer and demux clocking. The accelerometer and self-test signals can be detected in parallel.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) accelerometer, comprising:
    a first proof mass;
    a second proof mass;
    one or more first electrodes located adjacent to the first proof mass to sense movement of the first proof mass along a first axis in response to a linear acceleration along the first axis during a self-test time period;
    one or more second electrodes located adjacent to the second proof mass to sense movement of the second proof mass along the first axis during the self-test time period, wherein the first proof mass and the second proof mass move in-phase along the first axis in response to the linear acceleration along the first axis;
    self-test drive circuitry coupled to the first proof mass and the second proof mass, wherein the self-test drive circuitry is configured to continuously cause the first proof mass and the second proof mass to move out-of-phase along the first axis during the self-test time period; and
    sensing circuitry coupled to receive a sense signal from the one or more first electrodes and the one or more second electrodes, wherein the sensing circuitry outputs a self-test signal corresponding to the out-of-phase movement of the proof masses during the self-test time period, without a linear acceleration signal portion in the presence of linear acceleration.

2. The MEMS accelerometer of claim 1, wherein a positive electrode of the one or more first electrodes and a positive electrode of the one or more second electrodes are located in a first direction along the first axis, and a negative electrode of the one or more first electrodes and a negative electrode of the one or more second electrodes are located in an opposite direction from the first direction along the first axis.

3. The MEMS accelerometer of claim 2, wherein the out-of-phase movement of the first proof mass and the second proof mass comprises simultaneous movement of the first proof mass towards a corresponding positive electrode and the second proof mass towards an associated negative electrode.

4. The MEMS accelerometer of claim 1, further comprising:
    at least one first self-test drive electrode located adjacent to the first proof mass; and
    at least one second self-test drive electrode located adjacent to the second proof mass, wherein
    to continuously cause the first proof mass and the second proof mass to move out-of-phase during the self-test time period, the self-test drive circuitry provides a first self-test drive signal with a polarity to the at least one first self-test drive electrode and provides a second self-test drive signal with an opposite polarity to the at least one second self-test drive electrode.

5. The MEMS accelerometer of claim 1, wherein the first proof mass and the second proof mass are located within a plane of a MEMS layer, and wherein the first axis is within the plane of the MEMS layer.

6. The MEMS accelerometer of claim 1, wherein the first proof mass and the second proof mass are located within a plane of a MEMS layer, and wherein the first axis is perpendicular to the plane of the MEMS layer.

7. The MEMS accelerometer of claim 1, further comprising drive circuitry coupled to the first proof mass and the second proof mass to provide a first periodic drive signal to the first proof mass during the self-test time period and a second periodic drive signal to the second proof mass during the self-test time period.

8. The MEMS accelerometer of claim 7, wherein the first periodic drive signal and the second periodic drive signal have the same frequency and have an opposite polarity.

9. The MEMS accelerometer of claim 7, wherein the first periodic drive signal and the second periodic drive signal have the same polarity and the same frequency.

10. The MEMS accelerometer of claim 1, wherein the sensing circuitry is further configured to identify an error in the MEMS accelerometer based on the self-test signal.

11. The MEMS accelerometer of claim 1, wherein the self-test signal comprises code division multiple access (CDMA) signals.

12. The MEMS accelerometer of claim 1, wherein the sensing circuitry comprises common-mode sensing circuitry, further comprising differential sensing circuitry coupled to receive the sense signal from the one or more first electrodes and the one or more second electrodes, wherein the differential sensing circuitry outputs a linear acceleration signal corresponding to the in-phase movement of the proof masses during the self-test time period, without a self-test signal portion in the presence of the self-test drive circuitry continuously causing the first proof mass and the second proof mass to move out-of-phase.

13. A microelectromechanical (MEMS) accelerometer, comprising:
    a first proof mass;
    a second proof mass;
    one or more first electrodes located adjacent to the first proof mass to sense movement of the first proof mass along a first axis in response to a linear acceleration along the first axis during a self-test time period;
    one or more second electrodes located adjacent to the second proof mass to sense movement of the second proof mass along the first axis during the self-test time period, wherein the first proof mass and the second proof mass move in-phase along the first axis in response to the linear acceleration along the first axis;
    self-test drive circuitry coupled to the first proof mass and the second proof mass, wherein the self-test drive circuitry is configured to continuously cause the first proof mass and the second proof mass to move out-of-phase along the first axis during the self-test time period; and sensing circuitry coupled to receive a sense signal from the one or more first electrodes and the one or more second electrodes, wherein the sensing circuitry outputs a linear acceleration signal corresponding to the in-phase movement of the proof masses during the self-test time period, without a self-test signal portion in the presence of the self-test drive circuitry continuously causing the first proof mass and the second proof mass to move out-of-phase.

14. The MEMS accelerometer of claim 13, wherein the sensing circuitry comprises differential sensing circuitry, further comprising common-mode sensing circuitry coupled to receive the sense signal from the one or more first electrodes and the one or more second electrodes, wherein the common-mode sensing circuitry outputs a self-test signal corresponding to the out-of-phase movement of the proof masses during the self-test time period, without a linear acceleration signal portion in the presence of linear acceleration.

15. A microelectromechanical (MEMS) accelerometer, comprising:
a first proof mass;
a second proof mass;
one or more first electrodes located adjacent to the first proof mass to sense movement of the first proof mass along a first axis in response to a linear acceleration along the first axis during a self-test time period;
one or more second electrodes located adjacent to the second proof mass to sense movement of the second proof mass along the first axis during the self-test time period, wherein the first proof mass and the second proof mass move in-phase along the first axis in response to the linear acceleration along the first axis;
self-test drive circuitry coupled to the first proof mass and the second proof mass, wherein the self-test drive circuitry is configured to continuously cause the first proof mass and the second proof mass to move out-of-phase along the first axis during the self-test time period; and processing circuitry coupled to the one or more first electrodes and the one or more second electrodes, wherein the processing circuitry is configured to receive a sense signal during the self-test time period and to extract from the sense signal a self-test signal corresponding to the out-of-phase movement of the proof masses during the self-test time period and a linear acceleration signal corresponding to the in-phase movement of the proof masses during the self-test time period, and wherein the self-test signal does not include a response to an external vibration applied to the MEMS accelerometer.

16. The MEMS accelerometer of claim 15, wherein the processing circuitry is further configured to modify a linear acceleration determined from the linear acceleration signal based on the self-test signal.

17. The MEMS accelerometer of claim 16, wherein the modification is based on gain change associated with the movement of the first proof mass or the second proof mass.

18. The MEMS accelerometer of claim 15, wherein the processing circuitry comprises a demultiplexer, wherein the demultiplexer receives the sense signal, and wherein the demultiplexer extracts the self-test signal and the linear acceleration signal from the sense signal.

19. The MEMS accelerometer of claim 15, wherein the processing circuitry comprises sensing circuitry coupled to receive the sense signal, and wherein the sensing circuitry outputs the self-test signal without a linear acceleration signal portion in the presence of linear acceleration.

20. The MEMS accelerometer of claim 19, wherein the sensing circuitry comprises common-mode sensing circuitry and the processing circuitry further comprises differential sensing circuitry coupled to receive the sense signal, and wherein the differential sensing circuitry outputs the linear acceleration signal without a self-test signal portion in the presence of the self-test drive circuitry continuously causing the first proof mass and the second proof mass to move out-of-phase.

* * * * *